(12) United States Patent
Ahn et al.

(10) Patent No.: US 10,490,664 B2
(45) Date of Patent: Nov. 26, 2019

(54) FLEXIBLE HIGH PERFORMANCE INORGANIC MATTER FET USING BUILT-IN STRAIN OF INORGANIC MATTER ON INSULATOR WAFER

(71) Applicant: Industry-Academic Cooperation Foundation, Yonsei University, Seoul (KR)

(72) Inventors: Jong Hyun Ahn, Seoul (KR); Wonho Lee, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/099,198

(22) Filed: Apr. 14, 2016

(65) Prior Publication Data
US 2016/0308056 A1    Oct. 20, 2016

(30) Foreign Application Priority Data

Apr. 15, 2015 (KR) .................. 10-2015-0053018

(51) Int. Cl.
*H01L 29/78* (2006.01)
(52) U.S. Cl.
CPC ................ *H01L 29/7849* (2013.01)
(58) Field of Classification Search
CPC ............... H01L 29/7849; H01L 29/049; H01L 21/76256; H01L 29/78
USPC .................. 257/632, 9, 619; 438/666
See application file for complete search history.

(56) References Cited

U.S. PATENT DOCUMENTS 6,204,145 B1 * 3/2001 Noble .............. H01L 21/76264
257/254
2006/0076561 A1 * 4/2006 Hioki ................ G02F 1/133305
257/59

FOREIGN PATENT DOCUMENTS

KR    10-1999-0045409    6/1999

* cited by examiner

Primary Examiner — Dzung Tran
(74) Attorney, Agent, or Firm — Duane Morris LLP; Gregory M. Lefkowitz; Jason M. Nolan

(57) ABSTRACT

Provided is a method for manufacturing an inorganic material having a tensile stress, which includes: forming an inorganic stressor from an inorganic wafer made of an inorganic matter; forming an inorganic layer on the inorganic stressor; and etching a bulk inorganic matter at a lower portion of the inorganic stressor to generate an inorganic material having a tensile stress, wherein the inorganic layer has a tensile stress by etching the bulk inorganic matter to relieve a compressive stress applied to the inorganic stressor when the inorganic stressor is being formed. Therefore, FET and various circuits having higher charge mobility may be realized, and also, since characteristics may be maintained even when being applied to a plastic substrate, high performance flexible electronic device may be manufactured.

12 Claims, 10 Drawing Sheets

FLEXIBLE HIGH PERFORMANCE INORGANIC MATTER FET USING BUILT-IN STRAIN OF INORGANIC MATTER ON INSULATOR WAFER

CROSS-REFERENCE TO RELATED APPLICATIONS

This application claims priority under 35 U.S.C. § 119 to Korean Patent Application No. 10-2015-0053018 filed on Apr. 15, 2015 in the Korean Intellectual Property Office, the disclosure of which is incorporated herein by reference in its entirety.

TECHNICAL FIELD

The following disclosure relates to a method for manufacturing a device based on an inorganic semiconductor such as silicon, a compound semiconductor, an oxide semiconductor or the like, and in particular, to a method for manufacturing an inorganic material having a tensile stress by using built-in strain of an inorganic wafer, a material manufactured by the method, and a device based on the material.

BACKGROUND

In order to enhance charge mobility of a silicon semiconductor, existing semiconductor companies and various research groups have attempted various methods, and as a representative method, silicon is grown on a silicon-germanium alloy with a crystal lattice constant. If this method is used, a significant amount of tensile stress is applied to a silicon thin film due to lattice distortion of silicon-germanium and silicon, and resultant improvement of charge mobility may be expected. However, a silicon-germanium, also silicon thereon, should be grown again difficulty, and complex processes and great costs are also problems.

In case of an existing silicon-based flexible field effect transistor (FET) prepared on a flexible substrate such as an existing plastic or rubber substrate, a silicon oxide ($SiO_2$) sacrificial layer is etched from a silicon thin film wafer formed on an insulator in a silicon-on-insulator (SOI) wafer in order to separate the silicon thin film, and is transferred onto a flexible substrate. In this method, since silicon oxide at a lower portion is used as a sacrificial layer for etching, compressive stress present in the silicon oxide is removed while silicon is being separated. Also, since silicon at an upper portion is suspended in a suspended state, no stress is applied. Therefore, improvement of charge mobility caused by a strain rate is not expected.

RELATED LITERATURES

Patent Literature

Korean Unexamined Patent Publication No. 10-1999-0045409, entitled "Method for manufacturing a silicon gate FET"

SUMMARY

An embodiment of the present disclosure is directed to providing a method for manufacturing an inorganic semiconductor material, such as silicon, a compound semiconductor, an oxide semiconductor or the like, having a tensile stress without a buffer layer by using built-in strain of an inorganic wafer.

The present disclosure is also directed to providing a semiconductor device having improved electric characteristics, which includes an inorganic material having a tensile stress without a buffer layer by using built-in strain of an inorganic wafer.

In one general aspect, the present disclosure provides a method for manufacturing an inorganic material having a tensile stress, the method comprising: forming an inorganic stressor from an inorganic wafer made of an inorganic matter; forming an inorganic layer on the inorganic stressor; and etching a bulk inorganic matter at a lower portion of the inorganic stressor to generate an inorganic material having a tensile stress, wherein the inorganic layer has a tensile stress by etching the bulk inorganic matter to relieve a compressive stress applied to the inorganic stressor when the inorganic stressor is being formed.

According to another embodiment of the present disclosure, the inorganic stressor may be formed by oxidizing or nitriding the inorganic wafer, or by depositing metal or dielectrics on the inorganic wafer.

According to another embodiment of the present disclosure, the method may further comprise forming a device on the inorganic stressor.

According to another embodiment of the present disclosure, the method may further comprise patterning the inorganic wafer on which the inorganic stressor is formed.

According to another embodiment of the present disclosure, the method may further comprise: detaching the inorganic material having a tensile stress from the inorganic wafer: and transferring the detached inorganic material having a tensile stress to a substrate.

According to another embodiment of the present disclosure, the inorganic matter may be an inorganic matter which allows oxidization and nitridation.

According to another embodiment of the present disclosure, a tensile stress of the inorganic layer may vary depending on thickness or kind of the inorganic layer and the inorganic stressor.

According to another embodiment of the present disclosure, in the etching of a bulk inorganic matter at a lower portion of the inorganic stressor to generate an inorganic material having a tensile stress, the bulk inorganic matter at the lower portion of the inorganic stressor may be etched from an upper portion of the inorganic stressor.

According to another embodiment of the present disclosure, in the etching of a bulk inorganic matter at a lower portion of the inorganic stressor to generate an inorganic material having a tensile stress, the bulk inorganic matter at the lower portion of the inorganic stressor may be etched from a lower portion of the inorganic stressor by means of dry etching.

In another aspect of the present disclosure, there is provided an inorganic material having a tensile stress, comprising: an inorganic stressor formed from an inorganic wafer made of an inorganic matter; and an inorganic layer formed on the inorganic stressor to have a tensile stress, wherein the inorganic layer has a tensile stress by etching the bulk inorganic matter to relieve a compressive stress applied to the inorganic stressor when the inorganic stressor is being formed.

According to another embodiment of the present disclosure, the inorganic stressor may be formed by oxidizing or nitriding the inorganic wafer, or by depositing metal or dielectrics on the inorganic wafer.

According to another embodiment of the present disclosure, the inorganic material may be a semiconductor device having electric characteristics such as bandgap, or improved drain current, and charge mobility, by a tensile stress generated by etching the bulk inorganic matter.

According to another embodiment of the present disclosure, the inorganic material may further include a substrate located at a lower portion of the inorganic stressor.

According to another embodiment of the present disclosure, the inorganic matter may be an inorganic matter which allows oxidization and nitridation.

According to another embodiment of the present disclosure, a tensile stress of the inorganic layer may vary depending on thickness or kind of the inorganic layer.

According to the present disclosure, an internal lattice receiving a tensile stress may have an increased size so that electrons may move more rapidly. Therefore, FET and various circuits having higher charge mobility may be realized. Also, since characteristics may be maintained even when being applied to a plastic substrate, high performance flexible electronic material may be manufactured.

DETAILED DESCRIPTION OF EMBODIMENTS

Prior to the explanation of the present disclosure, solutions or technical spirit of the present disclosure will be summarized or essentially proposed for convenient understanding.

A method for manufacturing an inorganic material having a tensile stress according to an embodiment of the present disclosure includes: forming an inorganic stressor from an inorganic wafer made of an inorganic matter; forming an inorganic layer on the inorganic stressor; and etching a bulk inorganic matter at a lower portion of the inorganic stressor to generate an inorganic material having a tensile stress, wherein the inorganic layer has a tensile stress by etching the bulk inorganic matter to relieve a compressive stress applied to the inorganic stressor when the inorganic stressor is being formed.

Hereinafter, embodiments of the present disclosure, which can be easily implemented by those skilled in the art, are described in detail with reference to the accompanying drawings. However, these embodiments are just for better understanding of the present disclosure, and it will be obvious to those skilled in the art that the scope of the present disclosure is not limited to these embodiments.

The configuration of the present disclosure will be described in detail with reference to the accompanying drawings based on the embodiments of the present disclosure to clearly understand the solutions of the present disclosure. Here, when any drawing is explained, a component depicted in another drawing may also be cited, if necessary. Moreover, when explaining an operation principle of an embodiment of the present disclosure, detailed explanation of any known function or configuration related to the present disclosure or other matters may be omitted if it may unnecessarily make the essence of the present disclosure confused.

Figure 1:
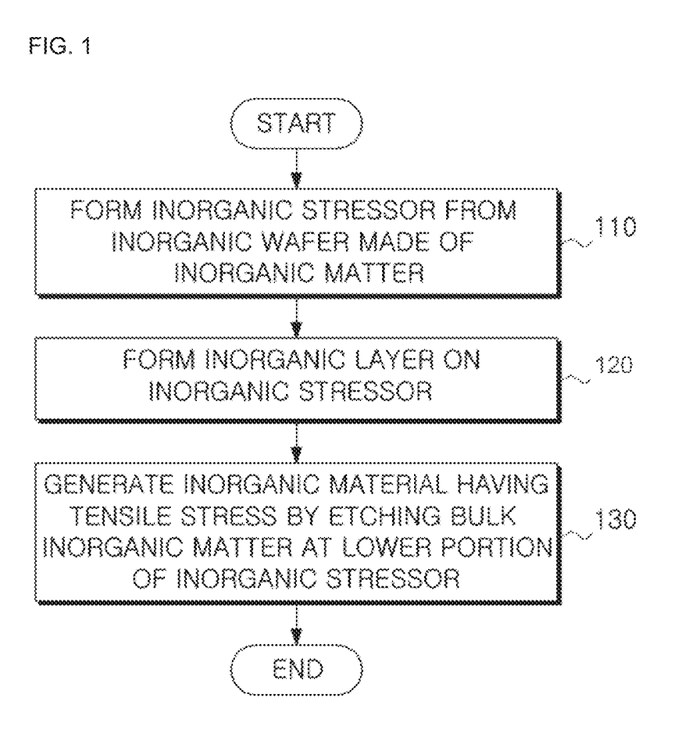
FIG. 1 is a flowchart for illustrating a method for manufacturing an inorganic material having a tensile stress according to an embodiment of the present disclosure.

FIG. 1 is a flowchart for illustrating a method for manufacturing an inorganic material having a tensile stress according to an embodiment of the present disclosure.

An inorganic material according to an embodiment of the present disclosure has a tensile stress by relieving a compressive stress generated while an inorganic stressor is being formed from a wafer made of the inorganic matter. Therefore, a material having a tensile stress may be made without any separate buffer layer made of SiGe or the like, and the material may have improved performance. In order to give a tensile stress to an inorganic material by using a compressive stress generated while an inorganic stressor is being formed from a wafer made of the inorganic matter, the following processes are performed.

Step 110 is a step of forming an inorganic stressor from an inorganic wafer made of an inorganic matter.

In more detail, an inorganic stressor is formed from an inorganic wafer made of an inorganic matter. The inorganic stressor may be formed by oxidizing or nitriding the inorganic wafer, or depositing a metal or dielectrics on the inorganic wafer. In other case, various processes in which the inorganic stressor may have a compressive stress may be used. An oxidation process will be described below as a representative example.

An oxidized inorganic stressor is formed by oxidizing an inorganic wafer at high temperature. While the inorganic stressor is formed through high-temperature oxidation, a compressive stress is formed in the inorganic stressor. A residual stress is a stress generated in the material during a processing or thermal treatment process, and such a stress is created by a result of irregular plastic deformation caused by cold working, tempering, welding or the like. The residual stress is classified into a residual tensile stress and a residual compressive stress. Regarding the residual stress, the residual compressive stress generally appears at a surface, and the residual tensile stress is generated at an inside. In case of a stress generated by deformation, a residual tensile stress appears at a surface, and a residual compressive stress is generated at an inside, contrary to the above. If surface tempering such as carburizing or high-frequency tempering is performed, a residual compressive force is created at a surface layer.

If an inorganic stressor is formed by depositing a metal or dielectrics, the inorganic stressor may be formed by depositing a metal by means of E-beam evaporation, thermal evaporation, sputtering or the like, or by depositing dielectrics by means of CVD, PVD, ALD or the like.

Step 120 is a step of forming an inorganic layer on the inorganic stressor.

In more detail, an inorganic layer to be used as a material is formed on the inorganic stressor formed in Step 110. The inorganic layer may be formed in various ways depending on the kind and shape of a material to be manufactured.

Step 130 is a step of generating an inorganic material having a tensile stress by etching a bulk inorganic matter at a lower portion of the inorganic stressor.

In more detail, the bulk inorganic matter at the lower portion of the inorganic stressor is etched to generate an inorganic material having a tensile stress. As the bulk material at the lower portion to which the inorganic stressor belongs is removed, the compressive stress is relieved, and the inorganic layer receives a tensile stress, which allows an inorganic material having a tensile stress to be generated. When the inorganic material receives a stress formed when oxidizing an inorganic wafer, as an internal lattice of the inorganic matter increases, electrons may move more rapidly. By using the inorganic material having a tensile stress generated as above, a field effect transistor (FET) or various circuits having high charge mobility may be realized. Also, since characteristics may be maintained even when being applied to a plastic substrate, high performance flexible electronic material may be manufactured.

In addition, the tensile stress of the inorganic layer may vary depending on thickness or kind of the inorganic layer and the inorganic stressor. The tensile stress varies depending on the kind of the inorganic layer or the inorganic stressor. In addition, the degree of tensile stress may be adjusted by controlling the thickness of the inorganic stressor or the inorganic layer formed on the inorganic stressor. The thickness of the inorganic stressor may be adjusted according to the degree of etching of the bulk inorganic matter at a lower portion. As the inorganic layer has a smaller thickness, the amount of tensile stress is greater. Therefore, the thickness of the inorganic layer may be adjusted according to the degree of tensile stress of a material to be manufactured. It is also possible to manufacture a material having a predetermined tensile stress by adjusting the kind, thickness and structure of the material.

Figure 2:
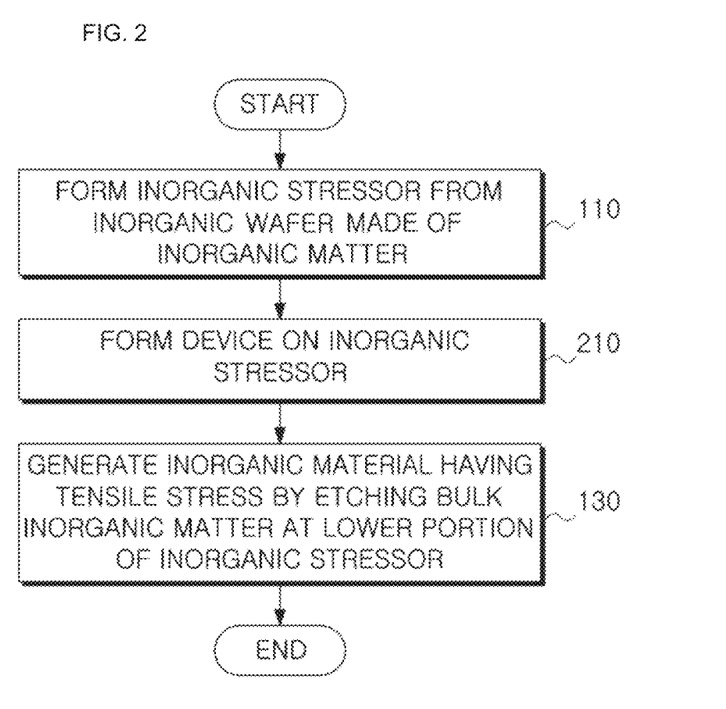
FIG. 2 is a flowchart for illustrating a method for manufacturing an inorganic material having a tensile stress according to another embodiment of the present disclosure.
Figure 3:
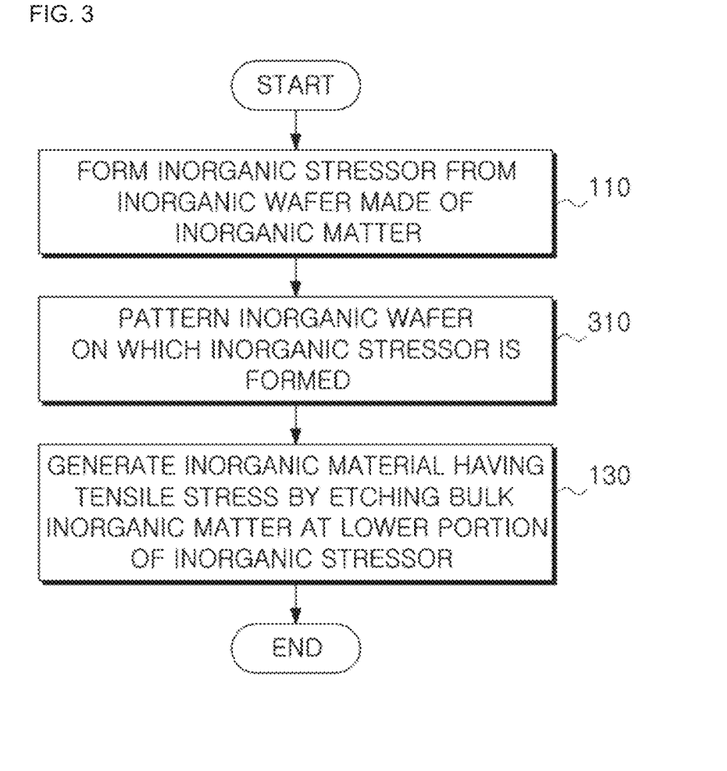
FIG. 3 is a flowchart for illustrating a method for manufacturing an inorganic material according to an embodiment of the present disclosure.
Figure 4:
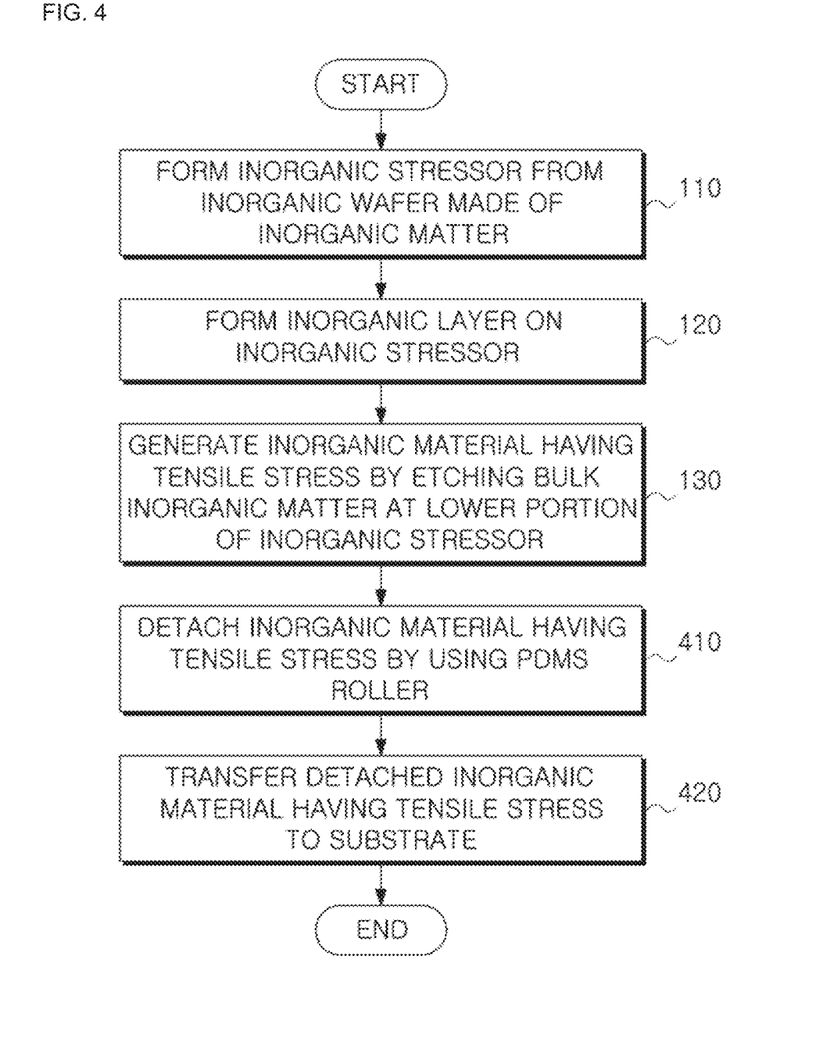
FIG. 4 is a flowchart for illustrating a method for manufacturing an inorganic material according to another embodiment of the present disclosure.

FIGS. 2 to 4 are flowcharts for illustrating a method for manufacturing an inorganic material having a tensile stress according to another embodiment of the present disclosure.

Step 210 is a step of forming a device on the inorganic stressor.

In more detail, a device to be implemented by using an inorganic matter is formed on the inorganic stressor formed from the inorganic wafer. The device may be formed after preparing the inorganic stressor by oxidizing the inorganic wafer, or the device may also be formed before oxidizing the inorganic wafer. When a FET is formed, a source, a drain and a gate are formed on the inorganic stressor. It is also possible to arrange a plurality of devices.

Step 310 is a step of patterning the inorganic wafer on which an oxidized inorganic stressor is formed.

In more detail, the inorganic wafer on which the inorganic stressor is formed may be patterned into a desired form. The patterning form may have a simple ribbon shape. After patterning into a ribbon shape, the bulk inorganic matter below the inorganic stressor may be etched according to the pattern to form a suspended inorganic matter ribbon.

Step 410 is a step of detaching the inorganic material having a tensile stress from the inorganic wafer.

In more detail, the inorganic material formed on the wafer is detached by using a polydimethyl siloxane (PDMS) roller or other equipment. Polydimethyl siloxane has various features. First, the PDMS may be stably adhered to a relatively broad area of the substrate. Thus, the PDMS may be satisfactorily applied to an uneven surface. Second, the PDMS has low interfacial free energy. Therefore, when another polymer is molded using the MMS, adhesion does not occur easily, thereby ensuring good molding. Third, the PDMS is an elastomer with excellent durability. This may be figured out from experiments in which remarkable degradation does not occur even though a molded PDMS stamp is used several hundred times and for several months. Fourth, the surface property of the PDMS may be easily modified by adjusting plasma generated by the formation of self-assembly monolayers (SAMs), and this may appear over a broad range of interfacial energy due to suitable interfacial interaction between substances. By using a roller made of polydimethyl siloxane (PDMS) having the above features, the inorganic material having a tensile stress is detached.

Step 420 is a step of transferring the detached inorganic material having a tensile stress to the substrate.

In more detail, the detached inorganic material having a tensile stress is transferred to a substrate to be used. The inorganic material having a tensile stress detached in Step 410 is transferred to the substrate to be used, made of a semiconductor material or the like.

The used inorganic matter may be an inorganic matter which allows oxidation and nitridation. Here, the inorganic matter may be silicon, a compound semiconductor, an oxide semiconductor or the like. In other case, another material having an internal residual stress may also be used. A residual stress occurring at a silicon wafer (SOI wafer) formed on the insulator may be shifted to a suspended silicon ribbon to generate a tensile stress and thus improve charge mobility. By doing so, a flexible FET based on high performance single crystal silicon may be manufactured. When the silicon wafer (SOI wafer) formed on the insulator is made, a residual stress is formed during a process of forming a silicon oxide film on the silicon wafer by means of high-temperature oxidation. By oxidizing the silicon wafer top form silicon oxide ($SiO_2$), a compressive stress is generated in the silicon oxide, and a top Si is laminated on the silicon oxide. The SOI wafer (top Si/$SiO_2$/lower bulk Si) is simply patterned into a ribbon form, and the lower bulk silicon is etched to form a suspended silicon ribbon. At this time, as the lower silicon to which silicon oxide belongs to is removed, the compressive stress is relieved, and silicon in the upper material region receives a tensile stress. Since the suspended Si ribbon contains silicon oxide in a lower portion thereof, a tensile stress is also included therein, and the stress is maintained after transferring, thereby ensuring improved mobility.

The silicon wafer formed on the insulator may be various kinds of wafers used at the present for various purposes, and this may also be applied to other kinds of laminated wafers having a residual stress. If only a sacrificial layer at a lower portion is etched for implementing a suspended form, a suspended membrane may be easily formed. In case of the silicon ribbon, a deformation ratio of about 0.2% is applied by means of the relieved compressive stress, and charge mobility increases by about 15 to 20% when a TFT is manufactured. By using this method, charge mobility of not only silicon but also various materials may be improved, and by means of the transferring process, not only a high performance single device but also various circuits may be implemented in a flexible electronic device application. In addition, during the transferring process, an automation system may be used, for example by a roll-transfer method, to allow rapid transfer to a large area, which may reduce high manufacture costs of existing flexible devices based on inorganic materials.

Figure 5A:
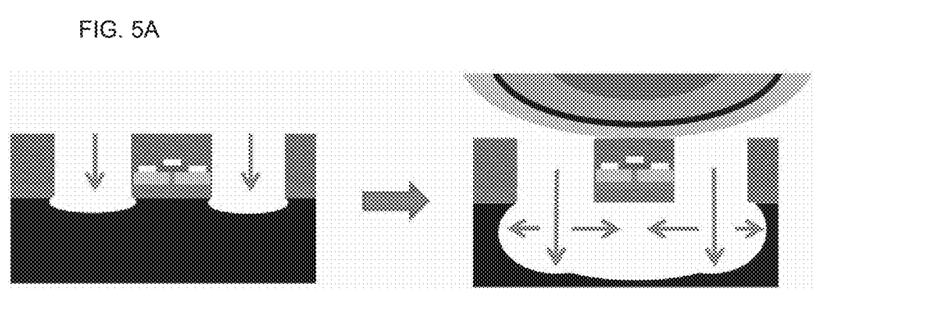
FIG. 5a is a diagram showing a process of etching an upper portion of a bulk inorganic matter according to an embodiment of the present disclosure.
Figure 5B:
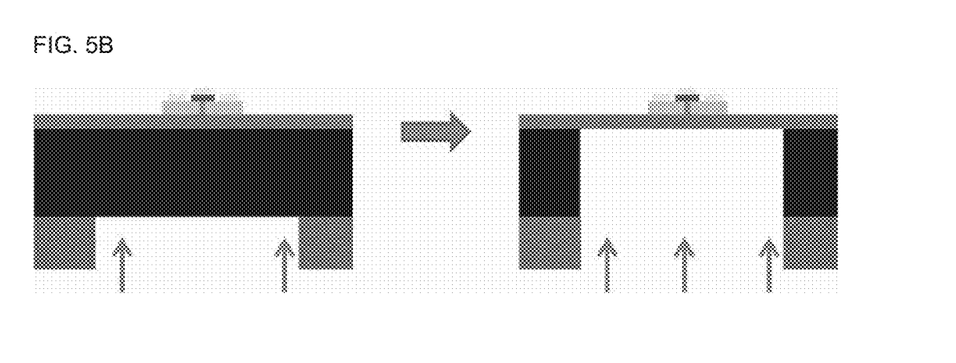
FIG. 5b is a diagram showing a process of etching a lower portion of a bulk inorganic matter according to an embodiment of the present disclosure.

FIG. 5 is a diagram showing a process of etching a bulk inorganic matter according to an embodiment of the present disclosure.

The bulk inorganic matter may be etched by means of two methods as follows.

First, the bulk inorganic matter at the lower portion of the inorganic stressor may be etched from an upper portion of the inorganic stressor. As shown in FIG. 5a, an inorganic matter ribbon or the like may be formed, and then etching may be performed from an upper portion in a lateral direction to form a suspended ribbon.

As another method, the bulk inorganic matter at the lower portion of the inorganic stressor may be etched from a lower portion of the bulk inorganic matter by means of dry etching. As shown in FIG. 5b, after a device is manufactured on the inorganic wafer (SOI wafer), bulk silicon may be removed from a lower portion of the bulk wafer by means of grinding and plasma dry etching to make a suspended Si device. If this method is used, $SiO_2$ at an intermediate portion may serve as an etch stopper in the plasma dry etching process, and a large suspended Si device may be easily manufactured. In this method, a suspended ribbon may also be formed, and the same performance improvement may be ensured.

Figure 6:
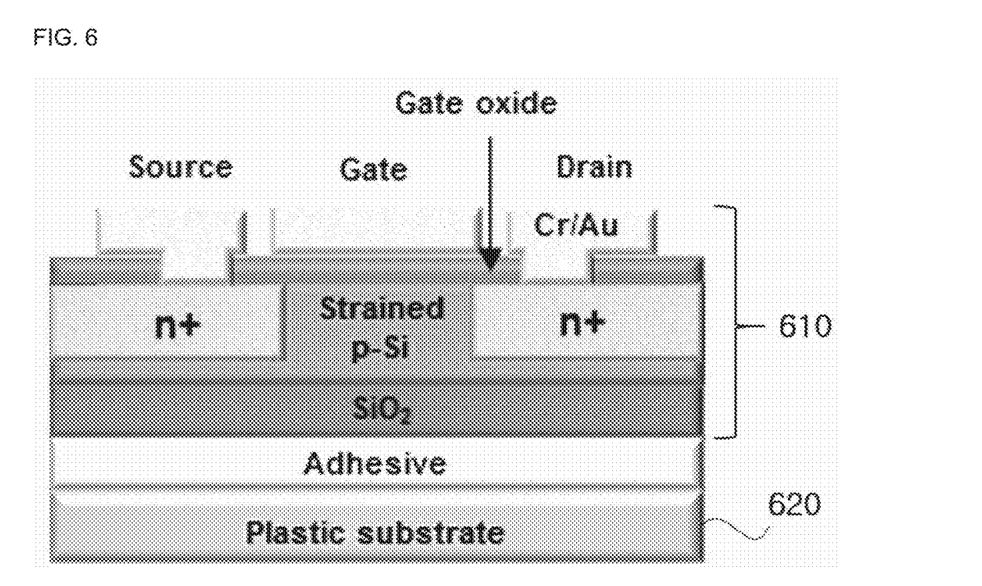
FIG. 6 shows an inorganic matter device having a tensile stress according to an embodiment of the present disclosure.

FIG. 6 shows an inorganic matter device having a tensile stress according to an embodiment of the present disclosure.

An inorganic material 610 transferred onto a substrate 620 is depicted. Here, the inorganic material 610 includes an inorganic stressor formed from an inorganic wafer made of an inorganic matter, and an inorganic layer formed on the inorganic stressor to have a tensile stress. Also, the inorganic layer has a tensile stress by etching the bulk inorganic matter to relieve a compressive stress applied to the inorganic stressor when the inorganic stressor is formed. The inorganic stressor may be formed by oxidizing or nitriding the inorganic wafer, or by depositing a metal or dielectrics on the inorganic wafer. The inorganic matter may use an inorganic matter such as silicon which allows oxidation and nitridation. In other case, another material having an internal residual stress may also be used. The inorganic material 610 having a tensile stress may be transferred to a substrate from a wafer made of the inorganic matter by means of a polydimethyl siloxane (PDMS) roller or the like. The tensile stress of the inorganic layer may vary depending on the thickness of the inorganic layer. The substrate may be a rigid substrate such as wafer, glass, metal foil or the like, or a polymer substrate such as plastic and rubber.

A semiconductor material according to an embodiment of the present disclosure includes an inorganic material having a tensile stress. The inorganic material having a tensile stress may be used instead of various inorganic materials used for the semiconductor material.

The inorganic material 610 having a tensile stress has been described above in detail with reference to FIGS. 1 to 5, and is not explained in detail here.

Figure 7:
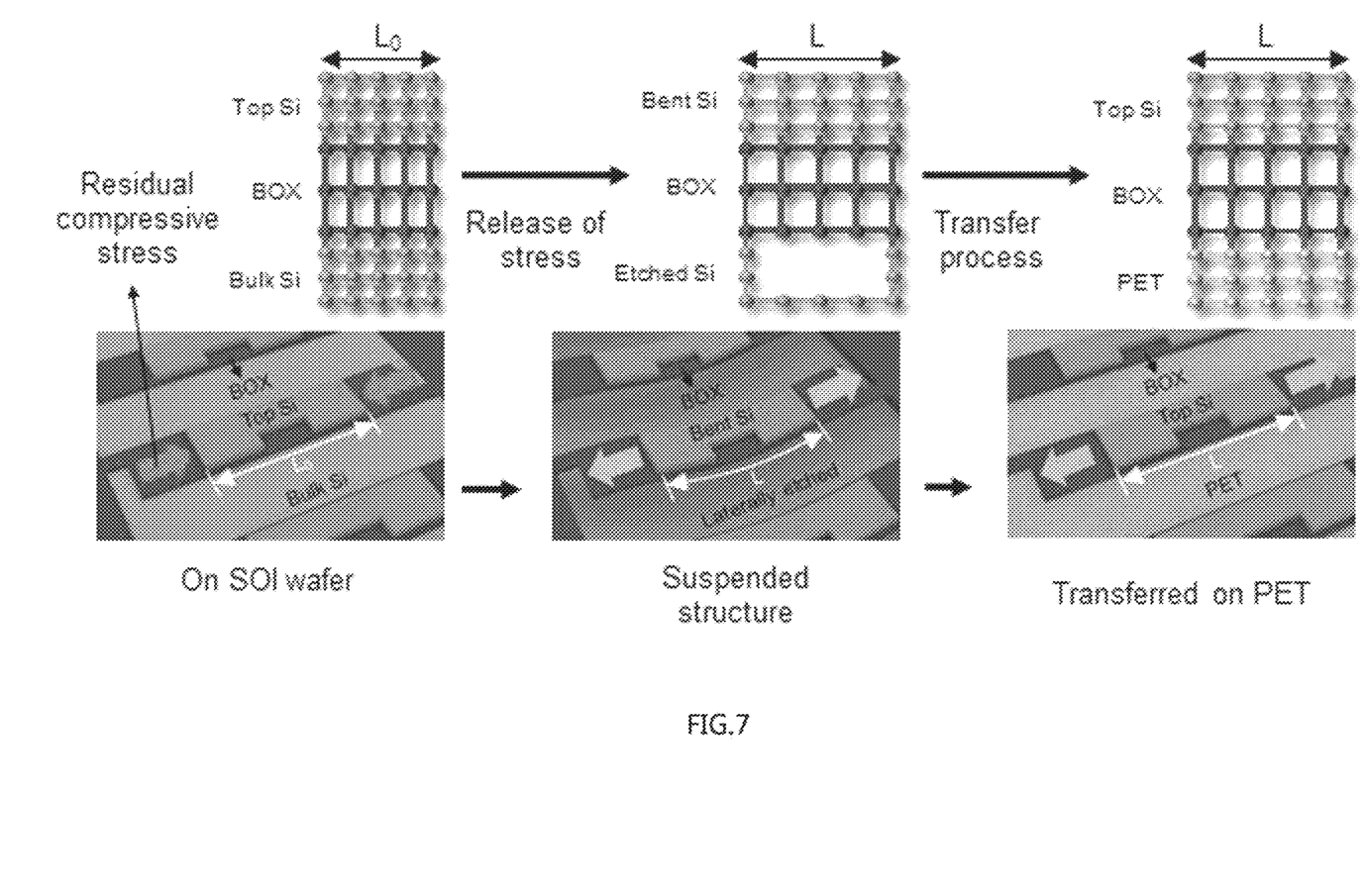
FIG. 7 is a diagram showing a process of analyzing a mechanism of manufacturing an inorganic material having a tensile stress and analyzing a stress thereof according to an embodiment of the present disclosure.

FIG. 7 is a diagram showing a process of analyzing a mechanism of manufacturing an inorganic material having a tensile stress and analyzing a stress thereof according to an embodiment of the present disclosure.

As an embodiment of the present disclosure, a process of manufacturing an organic material having a tensile stress and analyzing its characteristics is illustrated. First, a ribbon-type silicon pattern is formed on a SOI wafer. At this time, a compressive stress is present at an intermediate silicon oxide layer. After that, a suspended (capable of self-supporting) silicon ribbon is formed by etching a lower portion of the bulk silicon. At this time, as a compressive stress in the silicon oxide is relieved, a length increases, and a tensile stress is applied to an upper silicon ribbon. Even though this is transferred onto a PET substrate, the tensile stress applied to the upper silicon is maintained.

Figures 8A, 8B, 8C, 8D:
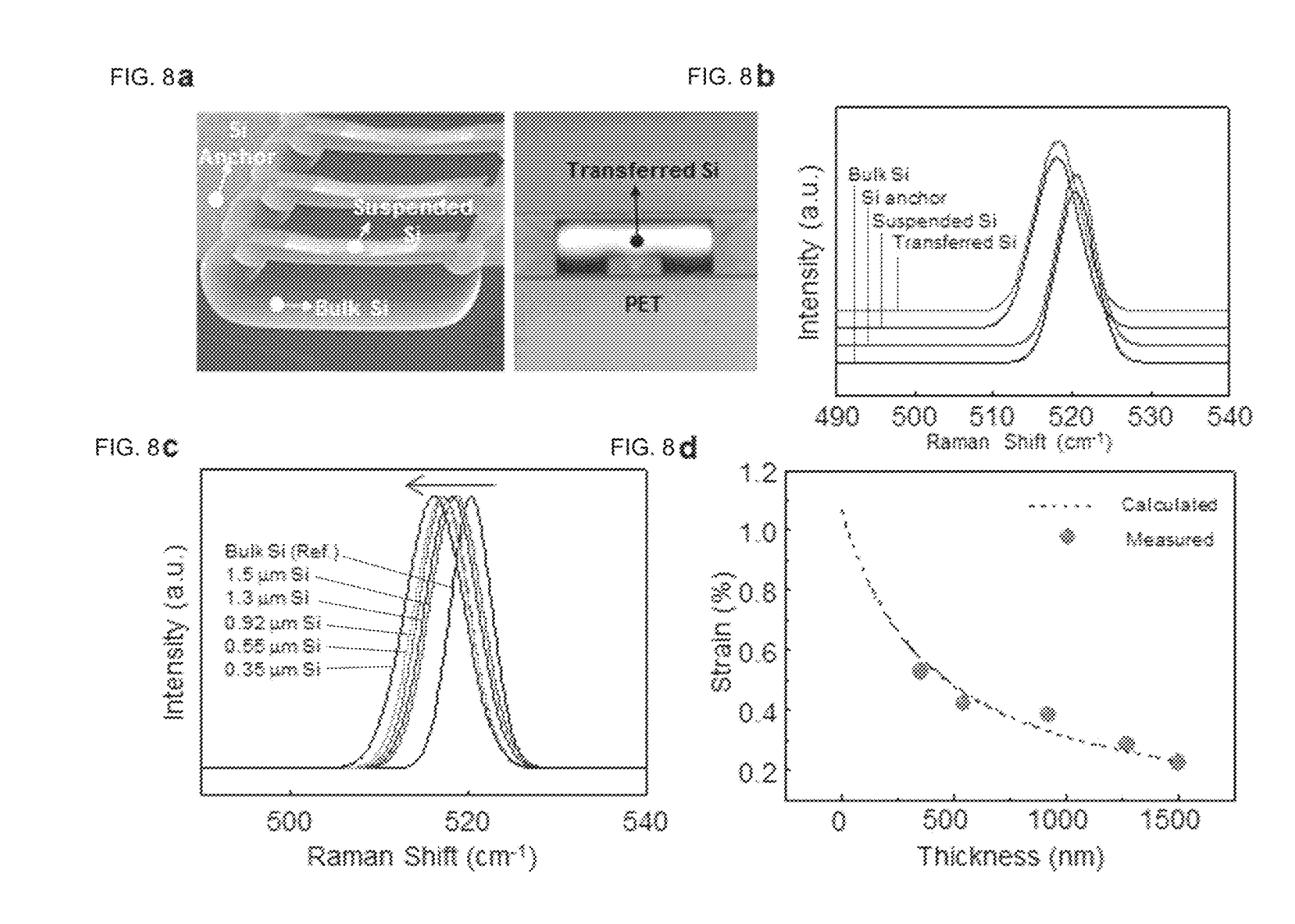
FIG. 8a is a diagram showing locations of suspended silicon/silicon oxide ribbon and silicon/silicon oxide ribbon transferred onto the PET substrate according to an embodiment of the present disclosure.
FIG. 8b is a graph showing a Raman pick location of each location according to an embodiment of the present disclosure.
FIG. 8c is a graph showing a changing amount of tensile stress according to the thickness of a top Si according to an embodiment of the present disclosure.
FIG. 8d is a graph showing the calculated and the measured values of tensile stress.

FIG. 8 shows an analysis result by a Raman spectroscopy, showing a tensile stress of an inorganic material according to an embodiment of the present disclosure. Here, (a) shows locations of suspended silicon/silicon oxide ribbon and silicon/silicon oxide ribbon transferred onto the PET substrate. (b) shows a Raman pick location of each location, in which locations of the suspended silicon pick and the transferred silicon pick are moved to the left in comparison to the bulk silicon and the anchor portion, which means that a tensile stress is applied. (c) is a graph showing a changing amount of tensile stress according to the thickness of a top Si, measured by a Raman spectroscopy, in which it may be found that an amount of stress increases as the thickness of the top Si is smaller. In (d), the calculated values and the measured values are compared.

Figures 9A, 9B, 9C:
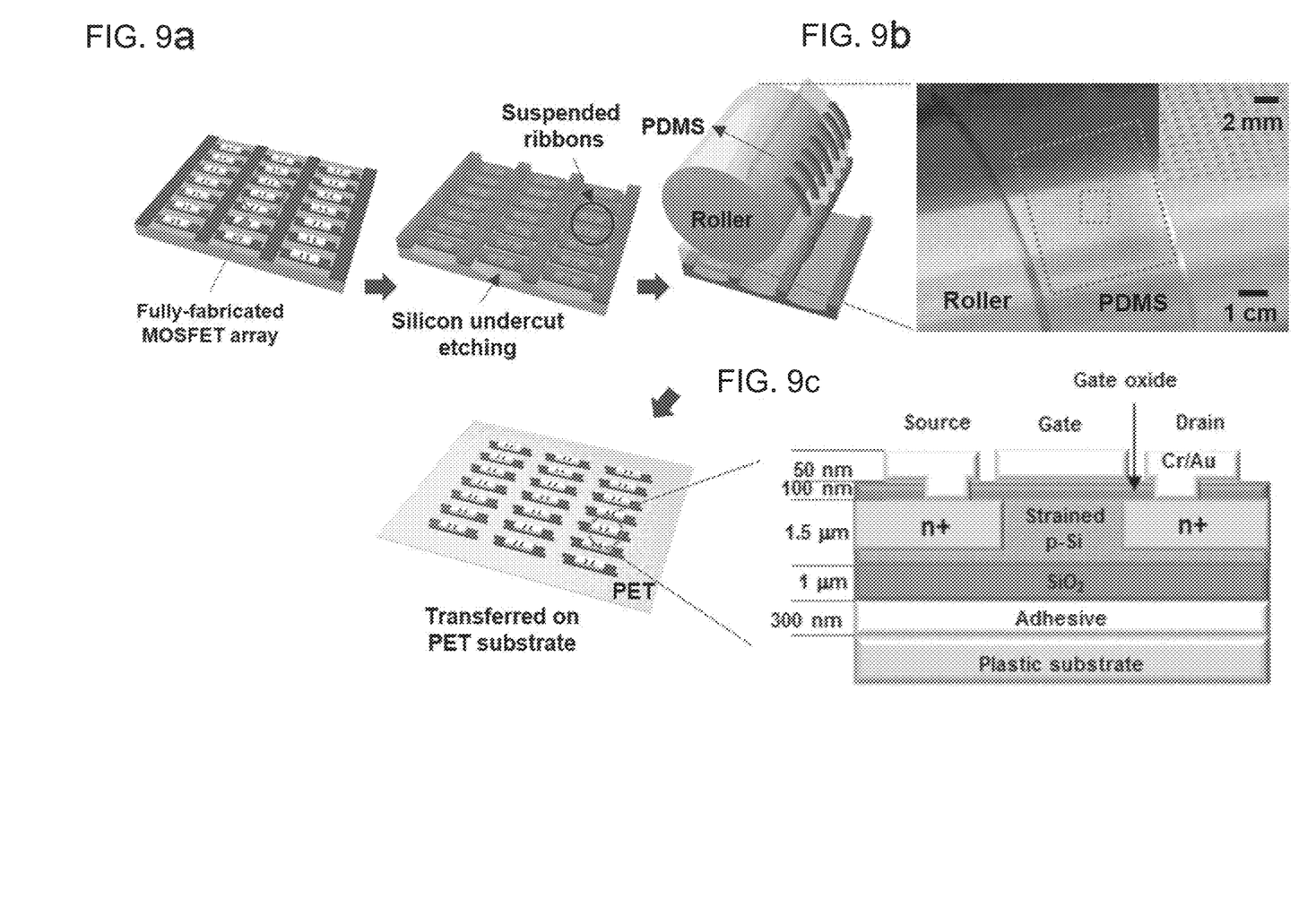
FIG. 9a is a diagram showing a manufactured inorganic matter device having tensile stress and improved electric characteristics involving an oxidized silicon wafer according to an embodiment of the present disclosure.
FIG. 9b is a diagram showing the silicon FET ribbon being detached by using a roller according to an embodiment of the present disclosure.
FIG. 9c is a diagram showing the sectional structure of the transferred silicon FET device according to an embodiment of the present disclosure.

FIG. 9 shows a process of transferring a silicon FET device having a tensile stress according to an embodiment of the present disclosure to a plastic substrate by means of roll-transfer printing. First, as shown in (a), a silicon wafer is oxidized to form silicon oxide, and then a silicon FET is formed on the wafer. After that, a suspended (capable of self-supporting) silicon FET ribbon is formed by etching a lower portion of the bulk silicon. At this time, the silicon FET ribbon has a tensile stress. After that, in (9), the silicon FET ribbon is detached using a roller, and the silicon FET ribbon having a tensile stress is transferred onto the PET substrate to manufacture an inorganic matter device. (c)

shows a sectional structure of the transferred silicon FET device having a tensile stress.

Figure 10A:
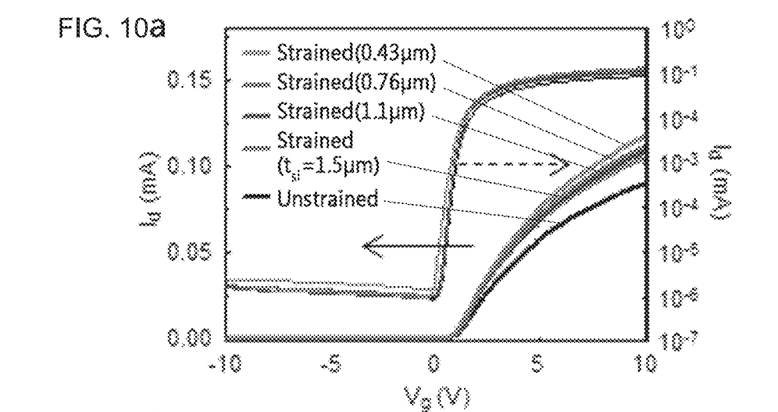
FIG. 10a shows a graph of electric characteristics of an inorganic matter device having different tensile stresses according to an embodiment of the present disclosure.
Figure 10B:
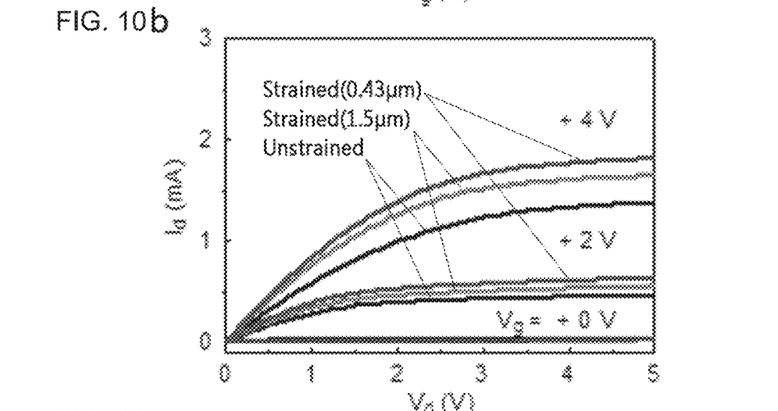
FIG. 10b shows a graph of output characteristics of the silicon FET of the material according to an embodiment of the present disclosure.
Figure 10C:
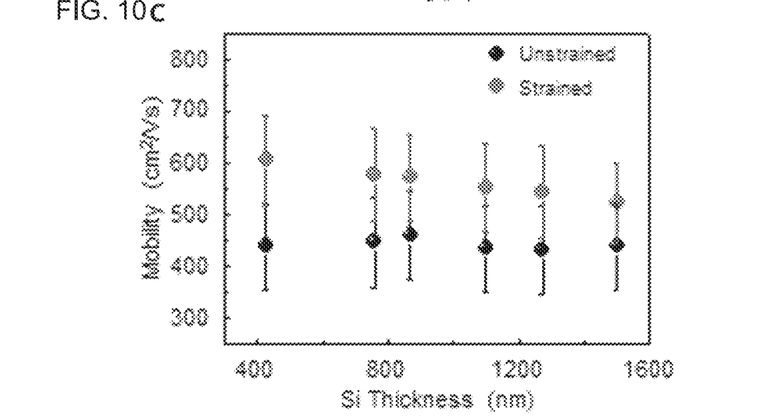
FIG. 10c is a graph showing charge mobility of a material prepared based on the obtained electric characteristic curve according to an embodiment of the present disclosure.

FIG. 10 shows electric characteristics of an inorganic matter device having different tensile stresses depending on the thickness of upper silicon according to an embodiment of the present disclosure.

In FIG. 10, (a) shows that electric characteristics of each thickness of the upper silicon of the silicon FET on a SOI wafer with respect to a channel having a width of 100 μm and a length of 10 μm at a drain voltage of 0.1 V are converted into a linear log scale. As the thickness of the upper silicon is smaller, a higher strain is applied to the silicon so that the drain current increases. (b) shows output characteristics of the silicon FET of the material measured in (a), at a gate voltage of 0 V to 4 V, and shows that the drain current increases as the thickness of silicon is smaller, similar to the above. (c) is a graph showing charge mobility of a material prepared based on the obtained electric characteristic curve, and it may be found that the increase range of charge mobility is improved as the thickness of upper silicon is smaller.

Figure 11A:
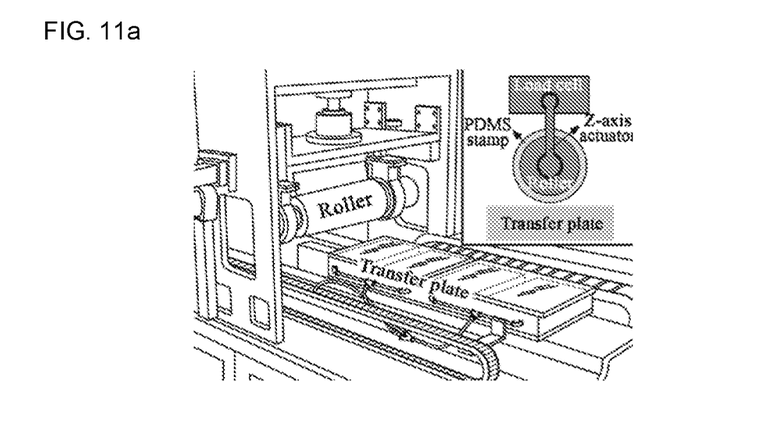
FIG. 11a shows an image of the automatic transferring machine and a structural front section of the automatic transferring machine.
Figure 11B:
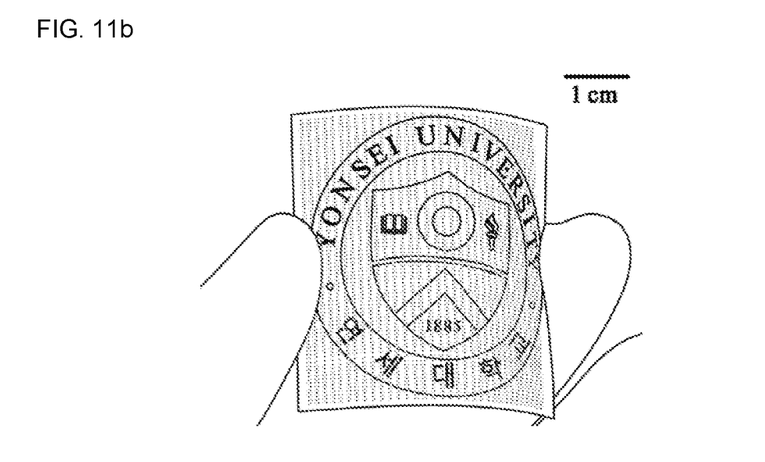
FIG. 11b shows an image of broad-band flexible TET array located at the PET substrate.
Figure 11C:
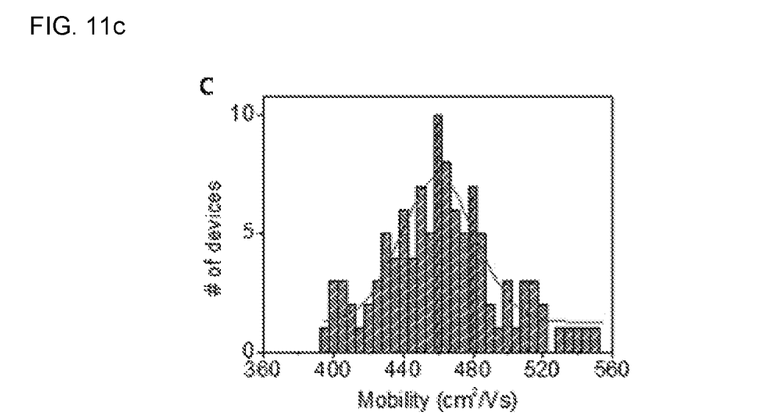
FIG. 11c shows a histogram of mobility distribution measured from the broad-band silicon FET array.

In FIG. 11(a) shows an automatic transferring machine and a structural front section of the automatic transferring machine, (b) shows an image of broad-band flexible TET array located at the PET substrate, and (c) shows a histogram of mobility distribution measured from the broad-band silicon FET array.

While the exemplary embodiments have been shown and described, it will be understood by those skilled in the art that various changes in form and details may be made thereto without departing from the spirit and scope of this disclosure as defined by the appended claims. In addition, many modifications can be made to adapt a particular situation or material to the teachings of this disclosure without departing from the essential scope thereof.

Therefore, it is intended that this disclosure not be limited to the particular exemplary embodiments disclosed as the best mode contemplated for carrying out this disclosure, but that this disclosure will include all embodiments falling within the scope of the appended claims.

REFERENCE SYMBOLS

610: inorganic material
620: substrate

What is claimed is:

1. A method for manufacturing an inorganic material having a tensile stress, the method comprising:
   forming an inorganic stressor from an inorganic wafer made of an inorganic matter, wherein a compressive stress is applied to the inorganic stressor when the inorganic stressor is being formed;
   forming an inorganic layer above the inorganic stressor; and
   etching a bulk inorganic matter at a lower portion of the inorganic stressor to generate an inorganic material having a tensile stress by removing the bulk inorganic matter at the lower portion to which the inorganic stressor belongs,
   wherein the inorganic layer has a tensile stress by etching the bulk inorganic matter to relieve the compressive stress and thickness of the inorganic stressor is controlled according to the degree of etching of the bulk inorganic matter to adjust the tensile stress, and
   wherein the inorganic material comprises the inorganic stressor and the inorganic layer.

2. The method for manufacturing an inorganic material having a tensile stress according to claim 1,
   wherein the inorganic stressor is formed by oxidizing or nitriding the inorganic wafer, or by depositing metal or dielectrics on the inorganic wafer.

3. The method for manufacturing an inorganic material having a tensile stress according to claim 1, further comprising:
   forming a device on the inorganic stressor.

4. The method for manufacturing an inorganic material having a tensile stress according to claim 1, further comprising:
   patterning the inorganic wafer on which the inorganic stressor is formed.

5. The method for manufacturing an inorganic material having a tensile stress according to claim 1, further comprising:
   detaching the inorganic material having a tensile stress from the inorganic wafer; and
   transferring the detached inorganic material having a tensile stress to a substrate.

6. The method for manufacturing an inorganic material having a tensile stress according to claim 1,
   wherein the inorganic matter is an inorganic matter which allows oxidization and nitridation.

7. The method for manufacturing an inorganic material having a tensile stress according to claim 1,
   wherein an amount of the tensile stress of the inorganic layer increases as thickness of the inorganic layer is smaller.

8. The method for manufacturing an inorganic material having a tensile stress according to claim 1,
   wherein in the etching of a bulk inorganic matter at a lower portion of the inorganic stressor to generate an inorganic material having a tensile stress, the bulk inorganic matter at the lower portion of the inorganic stressor is etched from an upper portion of the inorganic stressor.

9. The method for manufacturing an inorganic material having a tensile stress according to claim 1,
   wherein in the etching of a bulk inorganic matter at a lower portion of the inorganic stressor to generate an inorganic material having a tensile stress, the bulk inorganic matter at the lower portion of the inorganic stressor is etched from a lower portion of the inorganic stressor by means of dry etching.

10. The method for manufacturing an inorganic material having a tensile stress according to claim 1, wherein the lower portion of the inorganic stressor that is etched away is located directly beneath a portion of the inorganic layer that remains after etching.

11. The method for manufacturing an inorganic material having a tensile stress according to claim 1, wherein the inorganic layer is a suspended inorganic material.

12. The method for manufacturing an inorganic material having a tensile stress according to claim 11, wherein the suspended inorganic material is self-supporting.

* * * * *